US009390917B2

(12) United States Patent
Chawla et al.

(10) Patent No.: US 9,390,917 B2
(45) Date of Patent: Jul. 12, 2016

(54) CLOSED-SPACE SUBLIMATION PROCESS FOR PRODUCTION OF CZTS THIN-FILMS

(75) Inventors: Vardaan Chawla, Mountain View, CA (US); Mariana Rodica Munteanu, Santa Clara, CA (US)

(73) Assignee: ZETTA RESEARCH AND DEVELOPMENT LLC—AQT SERIES, Wilmington, DE (US)

( * ) Notice: Subject to any disclaimer, the term of this patent is extended or adjusted under 35 U.S.C. 154(b) by 388 days.

(21) Appl. No.: 13/401,512

(22) Filed: Feb. 21, 2012

(65) Prior Publication Data
US 2013/0217175 A1    Aug. 22, 2013

(51) Int. Cl.
H01L 21/00      (2006.01)
H01L 21/02      (2006.01)
H01L 31/0224    (2006.01)
H01L 31/032     (2006.01)

(52) U.S. Cl.
CPC ...... H01L 21/02557 (2013.01); H01L 21/0256 (2013.01); H01L 21/02568 (2013.01); H01L 21/02614 (2013.01); H01L 31/022425 (2013.01); H01L 31/0322 (2013.01); *Y02E 10/541* (2013.01); *Y02P 70/521* (2015.11)

(58) Field of Classification Search
CPC ............ H01L 21/0256; H01L 21/02568; H01L 21/02557; H01L 21/02614
USPC .......................................... 438/95, 478, 479
See application file for complete search history.

(56) References Cited

U.S. PATENT DOCUMENTS

| 6,001,420 | A  | * | 12/1999 | Mosely et al. | ............... | 427/258 |
| 2007/0163713 | A1 | * | 7/2007 | Kasai | ................. | C23C 16/4481 |
| | | | | | | 156/345.3 |
| 2008/0303035 | A1 | | 12/2008 | Oike | | |
| 2009/0205714 | A1 | | 8/2009 | Kuhnlein | | |
| 2009/0314342 | A1 | | 12/2009 | Bent | | |
| 2010/0206381 | A1 | | 8/2010 | Aida | | |
| 2010/0218814 | A1 | | 9/2010 | Deligianni | | |
| 2010/0221901 | A1 | * | 9/2010 | Cai et al. | ....................... | 438/492 |
| 2011/0094557 | A1 | * | 4/2011 | Mitzi et al. | ................... | 136/244 |
| 2011/0132462 | A1 | | 6/2011 | Free | | |
| 2011/0139071 | A1 | | 6/2011 | Oladeji | | |
| 2011/0155226 | A1 | | 6/2011 | Kusunoki | | |
| 2011/0226323 | A1 | | 9/2011 | Staley | | |
| 2012/0061790 | A1 | * | 3/2012 | Ahmed et al. | ................ | 257/459 |

(Continued)

FOREIGN PATENT DOCUMENTS

JP      2011146595 A     7/2011

OTHER PUBLICATIONS

I.D. Olekseyuk et al., "Phase Equilibria in the $Cu_2S$—ZnS—$SnS_2$ System", Journal of Alloys and Compounds 368, 135-143, 2004.

(Continued)

*Primary Examiner* — Victor A Mandala
*Assistant Examiner* — Quovaunda V Jefferson
(74) *Attorney, Agent, or Firm* — Mattingly & Malur, PC

(57) ABSTRACT

In one embodiment, a method includes depositing a CZT(S, Se) precursor layer onto a substrate, introducing a source-material layer comprising Sn(S, Se) into proximity with the precursor layer, and annealing the precursor layer in proximity with the source-material layer in a constrained volume.

19 Claims, 8 Drawing Sheets

A

B

C

D

E

(56) References Cited

U.S. PATENT DOCUMENTS

2012/0295396 A1* 11/2012 Teeter et al. .................... 438/95
2013/0037090 A1*  2/2013 Bag et al. ...................... 136/252

OTHER PUBLICATIONS

Hongxia Wang, Progress in Thin Film Solar Cells Based on $Cu_2ZnSnS_4$, Hindawi Publishing Corporation, International Journal of Photoenergy, vol. 2011, Artice ID 801292, 10 pages, 2011.

Alex Redinger et al., "Route Toward High-Efficiency Single-Phase on $Cu_2ZnSn(S,Se)_4$ Thin-Film Solar Cells: Model Experiments and Literature Review", IEEE Journal of Photovoltaics, 2156-3381, 2011.
Application as Filed for U.S. Appl. No. 13/401,558, filed Feb. 21, 2012.
International Preliminary Report of Patentability and Written Opinion of the International Searching Authority issued in international application No. PCT/US2013/027092; Sep. 4, 2014; 5 pages total.

* cited by examiner

CLOSED-SPACE SUBLIMATION PROCESS FOR PRODUCTION OF CZTS THIN-FILMS

TECHNICAL FIELD

This disclosure generally relates to the manufacturing of photovoltaic devices, and in particular to the production of photovoltaic devices from copper, zinc, tin, and sulfur/selenium (CZTS).

BACKGROUND

A typical photovoltaic cell includes a p-n junction, which can be formed by a layer of n-type semiconductor in direct contact with a layer of p-type semiconductor. The electronic differences between these two materials create a built-in electric field and potential difference. When a p-type semiconductor is placed in intimate contact with an n-type semiconductor, then a diffusion of electrons can occur from the region of high electron-concentration (the n-type side of the junction) into the region of low electron-concentration (the p-type side of the junction). The diffusion of carriers does not happen indefinitely, however, because of an opposing electric field created by the charge imbalance. The electric field established across the p-n junction induces separation of charge carriers that are created as result of photon absorption. When light is incident on this junction, the photons can be absorbed to excite pairs of electrons and holes, which are "split" by the built-in electric field, creating a current and voltage.

The majority of photovoltaic cells today are made using relatively thick pieces of high-quality silicon (approximately 200 µm) that are doped with p-type and n-type dopants. The large quantities of silicon required, coupled with the high purity requirements, have led to high prices for solar panels. Thin-film photovoltaic cells have been developed as a direct response to the high costs of silicon technology. Thin-film photovoltaic cells typically use a few layers of thin films (≤5 µm) of low-quality polycrystalline materials to mimic the effect seen in a silicon cell. A basic thin-film device consists of a substrate (e.g., glass, metal foil, plastic), a metal-back contact, a 1-5 µm semiconductor layer to absorb the light, another semiconductor layer to create a p-n junction and a transparent top conducting electrode to carry current. Since very small quantities of low-quality material are used, costs of thin-film photovoltaic cells are lower than those for silicon.

The two primary technologies in the thin-film solar space are copper indium gallium sulfur/selenide (CIGS) and cadmium telluride (CdTe). CIGS and CdTe photovoltaic cells have lower costs per watt produced than silicon-based cells and are making significant inroads into the photovoltaic market. However, CIGS and CdTe technologies are likely to be limited by the potential higher costs, lower material availability, and toxicity of some of their constituent elements (e.g., indium, gallium, tellurium, cadmium).

DESCRIPTION OF EXAMPLE EMBODIMENTS

CZTS Materials Generally

Figure 1:
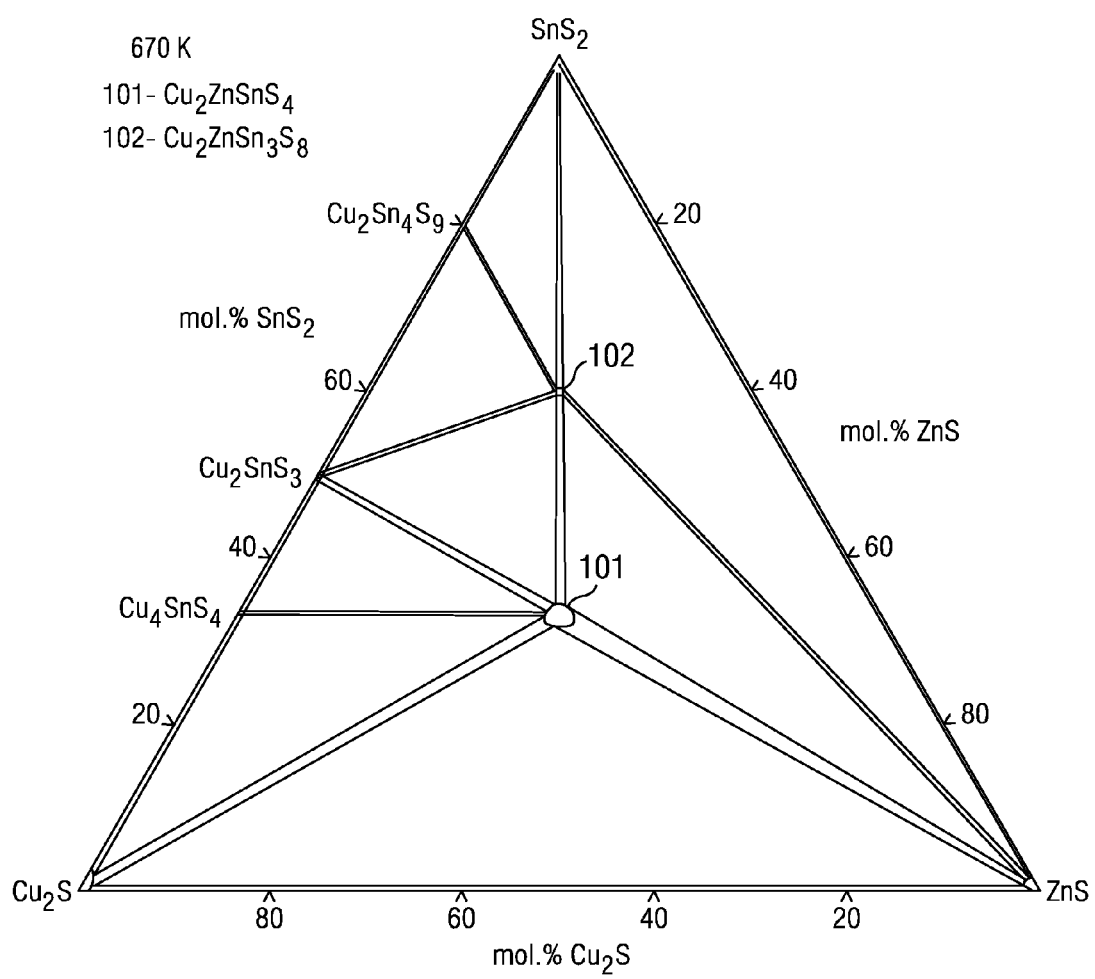
FIG. 1 illustrates a phase diagram for SnS—$Cu_2S$—ZnS systems at 670 K.

In particular embodiments, a thin-film in a photovoltaic cell may be manufactured using copper zinc tin sulfur/selenide (CZTS). CZTS materials have a favorable direct band gap (1.45 eV), a large absorption coefficient ($>10^4$ cm$^{-1}$), and are formed entirely from non-toxic, abundant elements that are produced in large quantities. CZTS also shares a number of similarities with CIGS as the equipment and processes used for deposition of these two materials are very similar. CZTS materials can be synthesized through sold-state chemical reactions between Zn(S, Se), $Cu_2$(S, Se), and Sn(S, Se)$_2$. FIG. 1 illustrates an isothermal phase diagram for SnS—$Cu_2S$—ZnS systems at 670 K. As illustrated in the phase diagram, $Cu_2ZnSnS_4$ forms in this system in region 101, while $Cu_2ZnSn_3S_8$ forms in region 102.

In particular embodiments, the CZTS fabrication processes may consist of two main steps. First, a precursor containing a combination of the constituent elements (copper, zinc, tin, sulfur, and selenium) may be deposited onto a substrate to form a precursor layer. Any suitable combination of the constituent elements may be used. The substrate is typically coated with a suitable electrode material. Deposition of the precursor layer may be performed using any suitable thin-film deposition process, such as, for example, chemical-vapor deposition, evaporation, atomic-layer deposition, sputtering, particle coating, spray pyrolysis, spin-coating, electro-deposition, electrochemical deposition, photoelectrochemical deposition, hot-injection, chemical-bath deposition, spin coating, another suitable deposition process, or any combination thereof. Second, the precursor may be annealed at high temperature (approximately >400° C.) to form the CZTS crystalline phase.

CZTS is unstable at high temperatures and thus ideal compositional stoichiometries are difficult to maintain. Furthermore, the annealing conditions used to form the crystalline phase may create electronic defects in the film. At temperatures greater than 450° C., crystalline CZTS can decompose and volatile constituent materials may evaporate from the film. In particular embodiments, CZTS may decompose according to the following reaction scheme:

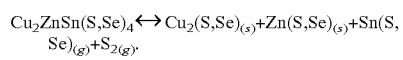

$Cu_2ZnSn(S,Se)_4 \leftrightarrow Cu_2(S,Se)_{(s)} + Zn(S,Se)_{(s)} + Sn(S,Se)_{(g)} + S_{2(g)}$.

In this reaction, tin sulfide and sulfur gas are evaporated from a crystalline CZTS film at high temperature, creating electronic defects that are detrimental to device performance. This means that for the reaction to proceed in the forward direction, Sn(S, Se) and/or $S_2$ gas must be evaporated from the film. Evolution of a gaseous phase in a reaction must also lead to an increase in the total pressure of the system. Although this disclosure describes a particular decomposition reaction for CZTS, this disclosure contemplates any suitable decomposition reaction for CZTS.

Figure 2:
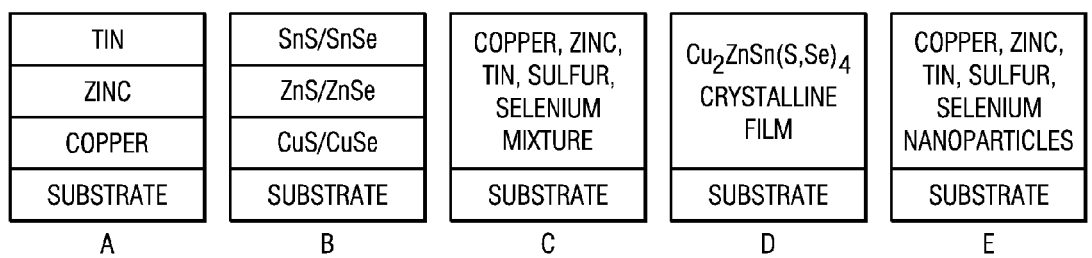
FIG. 2 illustrates example precursor layer architectures.

In particular embodiments, a fabrication apparatus may deposit a CZTS precursor layer onto a substrate. The precursor layer may comprise Cu, Zn, Sn, and one or more of S or Se. FIG. 2 illustrates example precursor layer architectures. In each example, the precursor layer is deposited on a suitable substrate. FIG. 2A illustrates an example precursor layer comprising of film layers of copper, zinc, and tin. In order to form a suitable CZTS material, one or more of sulfur or selenium may later be deposited onto the precursor layer, such as, for example, during a separate deposition step or during annealing. FIG. 2B illustrates an example precursor layer comprising film layers of $Cu_aS_b/Cu_aSe_b$, where approximately $0.5 \leq a \leq 2$ and approximately $b=1$, $Zn_cS_d/Zn_cSe_d$, where approximately $0.5 \leq c \leq 2$ and approximately $d=1$, and $Sn_eS_f/Sn_eSe_f$, where approximately $0.5 \leq e \leq 2$ and approximately $f=1$. The use of sulfide and selenide layers can be used to control the sulfur-to-selenium ratio in the precursor layer. In FIGS. 2A and 2B, the film layers may be deposited sequentially, with minimal mixing between the film layers. The layers in FIGS. 2A and 2B may be arranged in any suitable order, may have any suitable thickness, and each layer may have a different thickness. The thickness of the layers in FIGS. 2A and 2B may be used to control the composition of the initial precursor film and the final post-annealing film. FIG. 2C illustrates an example precursor layer comprising a mixture of copper, zinc, tin, sulfur, and selenium. Any suitable combination of these elements may be used. As another example, the precursor layer may comprise approximately 5-50 atomic % Cu, approximately 5-50 atomic % Zn, approximately 5-50 atomic % Sn, approximately 5-50 atomic % S, and approximately 5-50 atomic % Se. As yet another example, the precursor layer may comprise $Cu_xZn_ySn_z(S_\alpha Se_{1-\alpha})_\beta$, where approximately $0.5 \leq x \leq 3$, approximately $y=1$, approximately $0.5 \leq z \leq 3$, approximately $0 \leq \alpha \leq 5$, and approximately $0 \leq \beta \leq 5$. FIG. 2D illustrates an example precursor layer comprising a CZTS crystalline film ($Cu_2ZnSn(S, Se)_4$). For example, the crystalline film may be deposited using physical-vapor deposition at high-temperature such that the crystalline phase is formed during deposition. FIG. 2E illustrates an example precursor layer comprising nanoparticles of the constituent elements (Cu, Zn, Sn, S, Se) or compounds of the constituent elements (e.g., ZnS, SnS, ZnSe, SnSe). Although FIG. 2 illustrates particular precursor layers with particular compositions and architectures, this disclosure contemplates any suitable precursor layers with any suitable compositions or architectures. For example, additional constituents such as alkali metal salts, antimony, bismuth, another suitable constituent, or any combination thereof may be added to the precursor layer to enhance its properties (e.g., grain size) or performance. As another example, to improve the electrical properties of the precursor layer or to optimize the subsequent annealing process, the precursor layer may contain up to approximately 20 atomic % of one or more of Al, Si, Ti, V, Zn, Ga, Zr, Nb, Mo, Ru, Pd, In, Sn, Ta, W, Re, Ir, Pt, Au, Pb, or Bi.

In particular embodiments, the precursor layer may be annealed at high-temperature while controlling the stoichiometry of the layer and reducing or suppressing the decomposition of the CZTS material. CZTS films manufactured in this way may be device-quality, that is, the film may be incorporated into a photovoltaic device and used to generate electricity from light at a reasonable efficiency. The decomposition of CZTS at high temperature may be reduced or suppressed by controlling the formation of gaseous Sn(S, Se) and/or $S_2$ during the annealing process. For example, if the partial pressure of gaseous Sn(S, Se) and/or $S_2$ in the annealing apparatus is maintained at or above the equilibrium vapor pressure of the gaseous component, the decomposition of the CZTS film can be suppressed or even reversed. This may be achieved, for example, by annealing the CZTS film in a constrained volume where the partial pressure of gaseous Sn(S, Se) and/or $S_2$ can be controlled.

Separated Layers in a Constrained Volume

Figure 3:
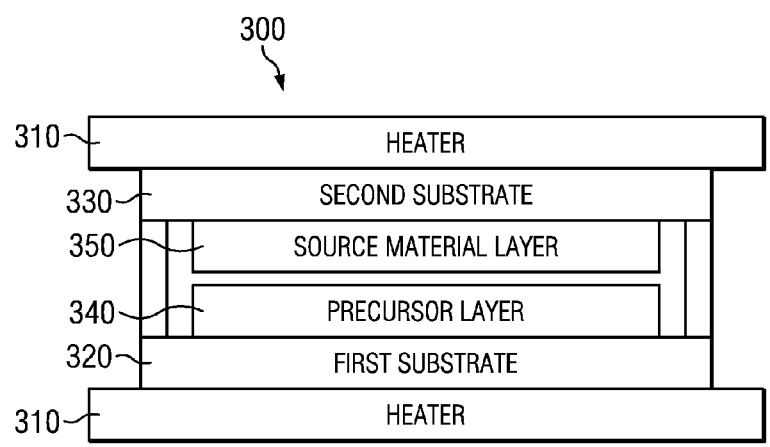
FIG. 3 illustrates an example closed-space sublimation apparatus.

In particular embodiments, a CZTS film may be manufactured by annealing the film in a constrained volume. FIG. 3 illustrates an example closed-space sublimation apparatus 300. Apparatus 300 includes a heater 310, a first substrate 320, a second substrate 330, a precursor layer 340, and a source-material layer 350. Heater 310 may be any suitable heating source. Heater 310 can provide heat via conduction, convection, radiation, or any combination thereof. For example, heater 310 may be a belt furnace that provides heat via a combination of conduction, convection, and radiation. First substrate 320 and second substrate 330 may be any suitable substrate capable of withstanding high temperatures and/or pressures. First substrate 320 and second substrate 330 may provide structural support for the film stack. For example, first substrate 320 or second substrate 330 may be soda-lime glass, a metal sheet or foil (e.g., stainless steel, aluminum, tungsten), a semiconductor (e.g., Si, Ge, GaAs), a polymer, another suitable substrate, or any combination thereof. Precursor layer 340 may be any suitable CZTS material, such as, for example, the CZTS materials described previously. In particular embodiments, precursor layer 340 comprises Cu, Zn, Sn, and one or more of S or Se. In alternative embodiments, precursor layer 340 comprises Cu, Zn, and Sn. S or Se may later be deposited onto the precursor layer in order to make a suitable CZTS material. Precursor layer 340 may be deposited on first substrate 320. Source-material layer 350 may be a film layer comprising Sn and one or more of S or Se. For example, source-material layer 350 may comprise 50% tin and 50% sulfur. As another example, source-material layer 350 may comprise 30-70% tin and 30-70% sulfur. As yet another example, source-material layer 350 may comprise 30-70% tin, 30-70% sulfur, and 30-70% selenium. As yet another example, source-material layer 350 may comprise $Cu(S, Se)_2$. Source-material layer 350 may be any suitable thickness. In particular embodiments, source-material layer 350 may have a thickness of approximately 100 nm to approximately 5000 nm. For example, source-material layer 350 may have a thickness of 100 nm, 200 nm, 300 nm, 400 nm, 500 nm, 600 nm, 700 nm, 800 nm, 900 nm, or 1000 nm. In particular embodiments, source-material layer 350 may be deposited on second substrate 330. In alternative embodiments, source-material layer 350 may be deposited onto precursor layer 340. Apparatus 300 may be capable of performing high-pressure, high-temperature processes. The reaction conditions in apparatus 300 may be precisely controlled, monitored, and adjusted to optimize the reaction yield and sample uniformity. Apparatus 300 may be a constrained volume, with minimal dead space in the reaction chamber. Although FIG. 3 illustrates a particular arrangement of heater 310, first substrate 320, second substrate 330, precursor layer 340, and source-material layer 350, this disclosure contemplates any suitable arrangement of heater 310, first substrate 320, second substrate 330, precursor layer 340, and source-material layer 350. For example, apparatus 300 may include a flexible continuous web that carries the individual components into the reaction chamber. Moreover, although FIG. 3 illustrates a particular number of heaters 310, first substrates 320, second substrates 330, precursor layers 340, and source-material layers 350, this disclosure contemplates any suitable number of heaters 310, first substrates 320, second substrates 330, precursor layers 340, and source-material layers 350. For example, apparatus 300 may include multiple precursor layers 340 or source-material layers 350.

In particular embodiments, apparatus 300 may introduce a source-material layer 350 into proximity with the precursor layer 340. Any suitable mechanism may be used to introduce source-material layer 350 into proximity with precursor layer 340. For example, sheets coated with precursor layer 340 and source-material layer 350 may be manually inserted into the reaction chamber of a closed-space sublimation apparatus (e.g., apparatus 300) such that precursor layer 340 and source-material layer 350 are directly facing each other in the reaction chamber. In particular embodiments, precursor layer 340 and source-material layer 350 may be separated from each other by a specified distance. The surface of precursor layer 340 may be substantially parallel to source-material layer 350. For example, precursor layer 340 and source-material layer 350 may be separated from each other by approximately 0.01 mm to approximately 5 mm. As yet another example, precursor layer 340 and source-material layer 350 may be in contact or substantially in contact with each other. In particular embodiments, source-material layer 350 may be introduced over precursor layer 350. For example, precursor layer 340 may be manually inserted into the reaction chamber of apparatus 300 such that precursor layer 340 is substantially lying in a horizontal position. Source-material layer 350 may then be manually inserted into the reaction chamber of apparatus 300 such that source-material layer 350 is also substantially lying in a horizontal position above precursor layer 340. In particular embodiments, the source-material layer 350 may be deposited onto precursor layer 340. Deposition of source-material layer 350 may be performed using any suitable thin-film deposition process, such as, for example, chemical-vapor deposition, evaporation, atomic-layer deposition, sputtering, particle coating, electro-deposition, another suitable deposition process, or any combination thereof. For example, a sheet coated with precursor layer 340 and source-material layer 350 (which is deposited over precursor layer 340) may be manually inserted into the reaction chamber of a closed-space sublimation apparatus (e.g., apparatus 300). Although this disclosure describes introducing source-material layer 350 over precursor layer 340 in a particular manner, this disclosure contemplates introducing source-material layer 350 over precursor layer 340 in any suitable manner.

In particular embodiments, apparatus 300 may anneal precursor layer 340 in the presence of source-material layer 350. The annealing may be performed in a constrained volume under isochoric, isobaric, isothermal, or other suitable conditions. The annealing may be performed at any suitable pressure. For example, annealing may occur under vacuum, under partial vacuum, at atmospheric pressure, or with an overpressure of gas. During annealing, the tin, sulfur, and selenium in source-material layer 350 will decompose at high temperatures, creating an atmosphere above the CZTS film that has a high concentration of SnS gas, SnSe gas, sulfur gas ($S_2$ or $S_8$), selenium gas, or any combination thereof. As source-material layer 350 decomposes into gaseous components, the constrained volume in apparatus 300 may create an overpressure of the SnS gas, SnSe gas, sulfur gas ($S_2$ or $S_8$), selenium gas, or any combination thereof. In particular embodiments, the CZTS decomposition reaction may be further controlled by adding SnS gas, SnSe gas, sulfur gas ($S_2$ or $S_8$), selenium gas, or any combination thereof to apparatus 300 to control the partial pressure of each gas. By maintaining relatively high partial pressures of these gases, the decomposition of precursor layer 340 at high temperatures may be reduced or suppressed by shifting the equilibrium of the CZTS decomposition reaction, such that it is slowed or even reversed. Thus, the CZTS precursor can be annealed at high temperature without any decomposition. In particular embodiments, other gaseous components may be added to apparatus 300 during annealing. For example, the atmosphere during annealing may comprise H, He, $N_2$, $O_2$, Ar, $H_2S$, Kr, $H_2Se$, Xe, another suitable gas, or any combination thereof. In particular embodiments, the total pressure of the gas atmosphere in apparatus 300 may range from, for example, $10^{-8}$ Pa to approximately $10^7$ Pa. In particular embodiments, apparatus 300 may heat precursor layer 340 to a first temperature of approximately 350° C. to approximately 700° C. during annealing. Heaters 210 may heat the system using any suitable type of heating, such as, for example, conduction, convection, radiation, or any combination thereof. For example, precursor layer 340 may be heated to a first temperature of 350° C., 360° C., 380° C., 400° C., 420° C., 440° C., 460° C., 480° C., 500° C., 520° C., 540° C., 560° C., 580° C., 600° C., 620° C., 640° C., 660° C., 680° C., or 700° C. Precursor layer 340 may then be held at the first temperature for 5 minutes to 120 minutes. Precursor layer 340 may then be cooled to a second temperature of approximately 20° C. to approximately 100° C. In particular embodiments, precursor layer 340 and source-material layer 350 may be compressed during annealing. For example, precursor layer 340 and source-material layer 350 may be placed substantially in contact with each other and then laterally compressed, such as, for example, by applying mechanical force via a weight, a vice, hydraulics, another suitable apparatus, or any combination thereof. In particular embodiments, precursor layer 340 may comprise Cu, Zn, and Sn. One or more of S or Se may then be deposited onto precursor layer 340 during annealing. For example, one or more of S or Se may be deposited from source-material layer 350 onto precursor layer 340 during annealing. As source-material layer 350 is heated during annealing, source-material layer 350 may decompose to form sulfur and selenium gas, which may then be deposited onto precursor layer 340. Although this disclosure describes annealing precursor layer 340 in a particular manner, this disclosure contemplates annealing precursor layer 340 in any suitable manner.

Figure 4A:
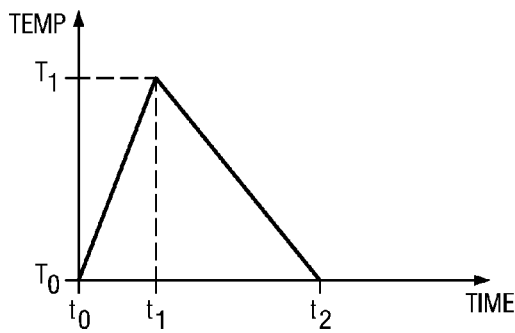
FIGS. 4A-4G illustrate example annealing temperature profiles.
Figure 4B:
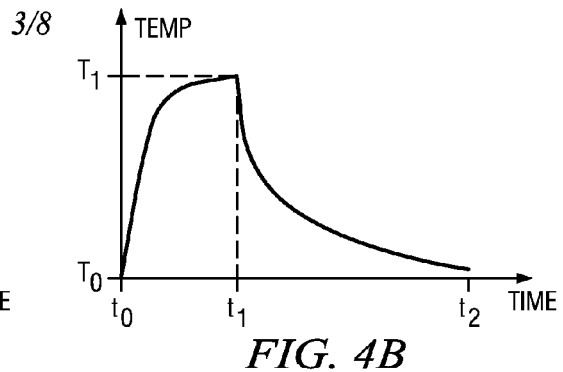
Figure 4C:
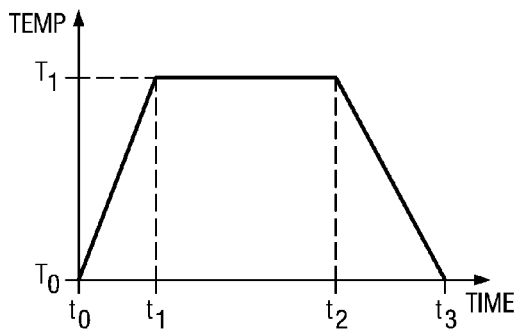
Figure 4D:
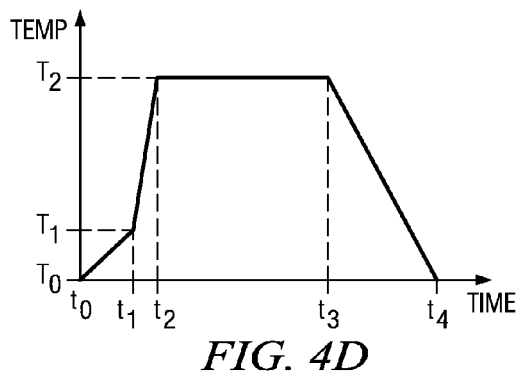
Figure 4E:
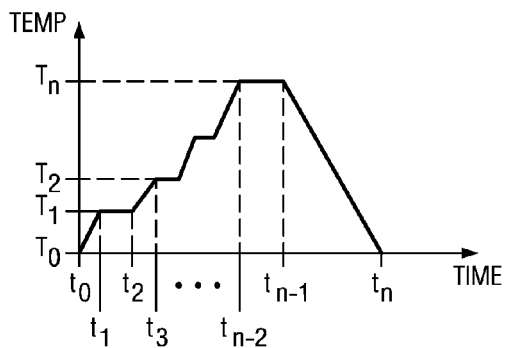
Figure 4F:
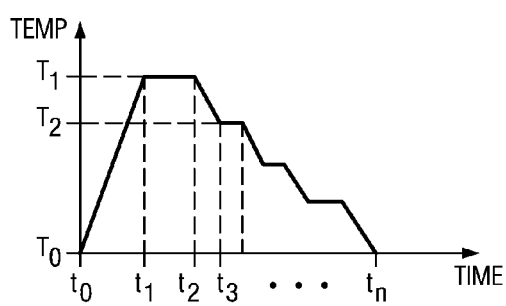
Figure 4G:
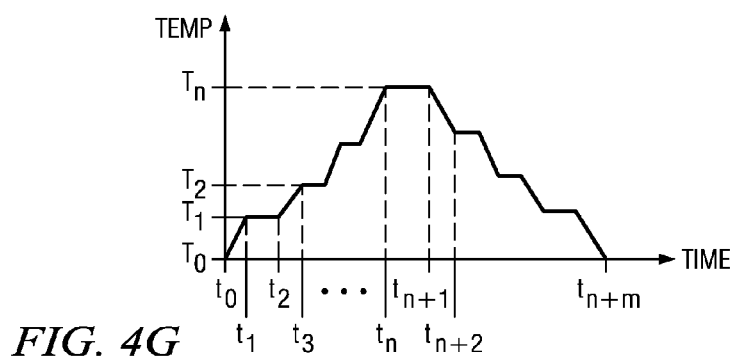

FIGS. 4A-4G illustrate example annealing temperature profiles. In particular embodiments, apparatus 300 may anneal a CZTS layered structure by using pulsed annealing, flash annealing, laser annealing, furnace annealing, lamp annealing, another suitable annealing process, or any combination thereof. Annealing may be performed using a light source (e.g., a halogen lamp or a laser), resistive heaters, lasers, another suitable heating source, or any combination thereof. The heating may be effected either directly onto the surface of a film layer or via a back substrate. FIGS. 4A-4G illustrate example plots of temperature as a function of time (T=f(t)) during annealing of the layered structure. In FIG. 4A, the temperature of the layered structure is first increased from $T_0$ to $T_1$ at a temperature ramp rate (increase rate) of $(T_1-T_0)/(t_1-t_0)$, followed by a decrease to $T_0$ at a cooling rate of $(T_0-T_1)/(t_2-t_1)$. In FIG. 4B, the temperature of the layered structure is first increased from $T_0$ to $T_1$ at a ramp rate that decreases with increasing temperature, followed by a decrease to $T_0$ at a cooling rate at a cooling rate that is initially fast and decreases with decreasing temperature. In FIG. 4C, the temperature of the layered structure is first increased from $T_0$ to $T_1$ with a temperature ramp rate of $(T_1-T_0)/(t_1-t_0)$. The temperature of the layered structure is then held at approximately $T_1$ for a time $(t_2-t_1)$ before subsequently reducing the temperature to $T_0$ with a cooling rate of $(T_0-T_1)/(t_3-t_2)$. In FIG. 4D, the layered structure is first preheated to a temperature $T_1$ before increasing the temperature of the layered structure from $T_1$ to $T_2$ with a temperature ramp rate of $(T_2-T_1)/(t_2-t_1)$. The temperature of the layered structure is then held at approximately $T_2$ for a time $(t_3-t_2)$ before subsequently reducing the temperature to $T_0$ with a cooling rate of $(T_0-T_2)/(t_4-t_3)$. In FIG. 4E, the layered structure is annealed using a step-wise temperature profile, where the layer structure is first heated to $T_1$ with a ramp rate of $(T_1-T_0)/(t_1-t_0)$, held at approximately $T_1$ for a time $(t_2-t_1)$, then heated to $T_2$ with a ramp rate of $(T_2-T_1)/(t_3-t_2)$, held at approximately $T_2$ for a time $(t_4-t_3)$, and so on until a target temperature $T_n$ is reached. In FIG. 4F, the temperature of the layered structure is first increased from $T_0$ to $T_1$ with a temperature ramp rate of $(T_1-T_0)/(t_1-t_0)$, held at approximately T1 for a time $(t_2-t_1)$, followed by step-wise cooling where the layered structure is cooled to $T_2$ at a rate $(T_2-T_1)/(t_3-t_2)$, held at approximately $T_2$ for a time $(t_4-t_3)$, and so on until a target temperature $T_0$ is reached. In FIG. 4G, the layered structure is heated from $T_0$ to $T_n$ using the step-wise heating method described with reference to FIG. 4E, held at approximately $T_n$ for a time $(t_{n+1}-t_n)$, and then cooled to $T_0$ using the step-wise cooling method described with reference to FIG. 4F. Although FIGS. 4A-4G illustrates and this disclosure describes particular annealing temperature profiles, this disclosure contemplates any suitable annealing temperature profiles.

Figure 5:
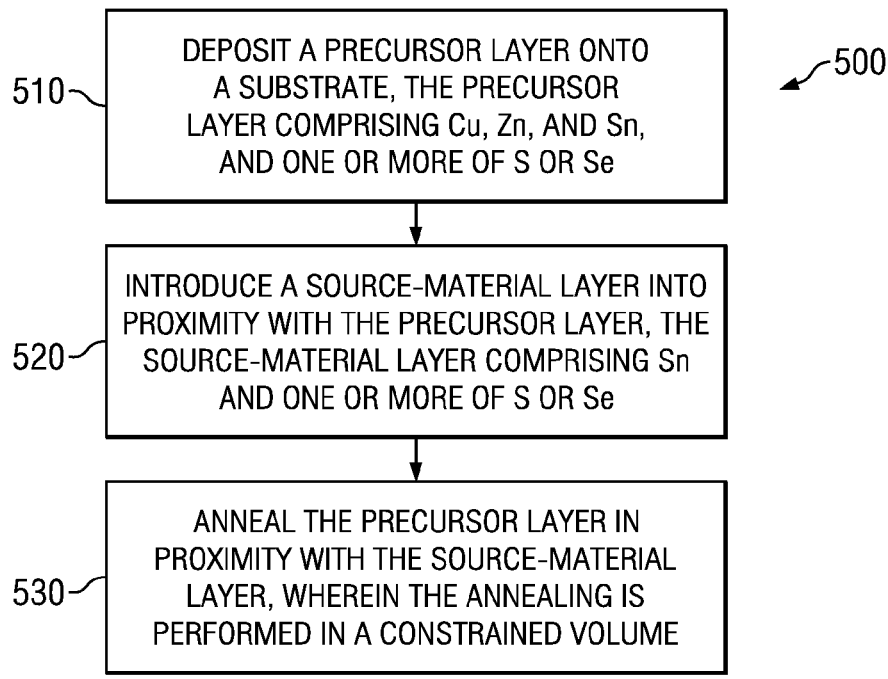
FIG. 5 illustrates an example method for producing a CZTS thin-film by annealing a precursor layer and a source-material layer in a constrained volume.

FIG. 5 illustrates an example method 500 for producing a CZTS thin-film by annealing a precursor layer 340 and a source-material layer 350 in a constrained volume. The method may begin at step 510, where precursor layer 340 is deposited onto first substrate 320. Precursor layer 340 may comprise Cu, Zn, Sn, and one or more of S or Se. At step 520, source-material layer 350 may be introduced over precursor layer 340. Source-material layer 350 may comprise Sn and one or more of S or Se. At step 530, apparatus 300 may anneal precursor layer 340 in proximity with source-material layer 350 Annealing may be performed in a constrained volume. Particular embodiments may repeat one or more steps of the method of FIG. 5, where appropriate. Although this disclosure describes and illustrates particular steps of the method of FIG. 5 as occurring in a particular order, this disclosure contemplates any suitable steps of the method of FIG. 5 occurring in any suitable order. For example, method 500 may be repeated multiple times with repeated deposition of precursor layers to provide a multi-layered variable or graded band gap absorber. Moreover, although this disclosure describes and illustrates particular components, devices, or systems carrying out particular steps of the method of FIG. 5, this disclosure contemplates any suitable combination of any suitable components, devices, or systems carrying out any suitable steps of the method of FIG. 5.

Figure 6:
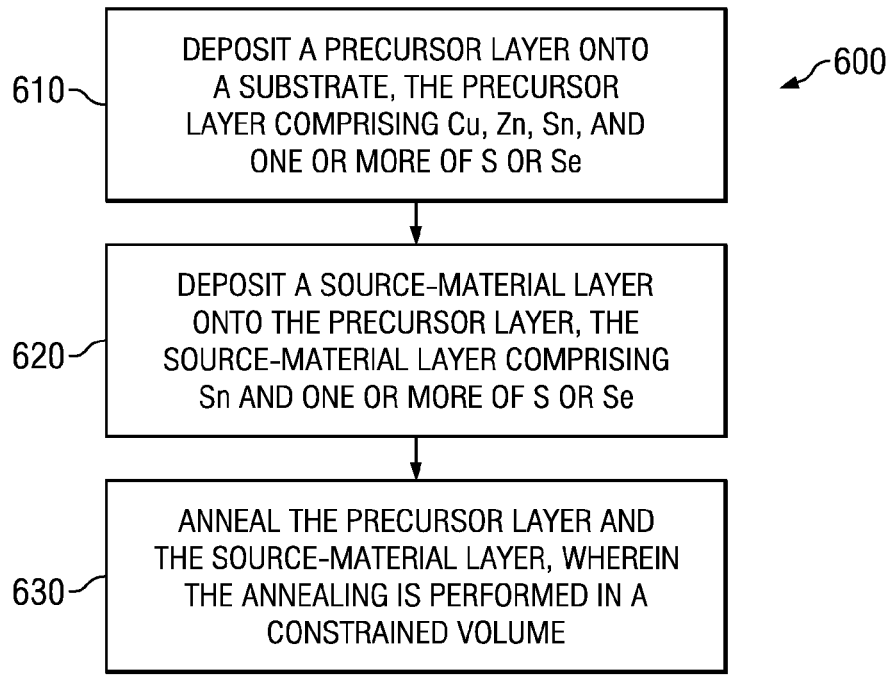
FIG. 6 illustrates an example method for producing a CZTS thin-film by depositing a source-material layer onto a precursor layer.

FIG. 6 illustrates an example method 600 for producing a CZTS thin-film by depositing a source-material layer 350 onto a precursor layer 340. The method may begin at step 610, where precursor layer 340 is deposited onto first substrate 320. Precursor layer 340 may comprise Cu, Zn, Sn, and one or more of S or Se. At step 620, source-material layer 350 may be deposited onto precursor layer 340. Source-material layer 350 may comprise Sn and one or more of S or Se. At step 630, apparatus 300 may anneal precursor layer 340 and source-material layer 350. Annealing may be performed in a constrained volume. Particular embodiments may repeat one or more steps of the method of FIG. 6, where appropriate. Although this disclosure describes and illustrates particular steps of the method of FIG. 6 as occurring in a particular order, this disclosure contemplates any suitable steps of the method of FIG. 6 occurring in any suitable order. Moreover, although this disclosure describes and illustrates particular components, devices, or systems carrying out particular steps of the method of FIG. 6, this disclosure contemplates any suitable combination of any suitable components, devices, or systems carrying out any suitable steps of the method of FIG. 6.

Annealing with a Controlled Overpressure

Figure 7:
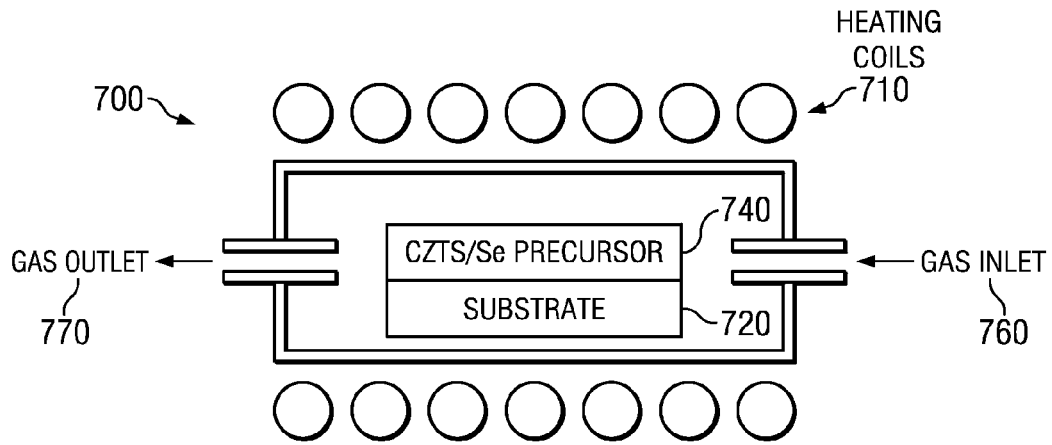
FIG. 7 illustrates an example tube-furnace apparatus.

In particular embodiments, a CZTS film may be manufactured by controlling the pressure of decomposition gasses formed during annealing. FIG. 7 illustrates an example tube-furnace apparatus 700. Apparatus 700 includes a heating coil 710, a substrate 720, a precursor layer 740, a gas inlet 760, and a gas outlet 770. Heating coil 710 may be any suitable heating source. Heater 710 can provide heat via conduction, convection, radiation, or any combination thereof. For example, heater 710 may be a belt furnace that provides heat via a combination of conduction, convection, and radiation. Substrate 720 may be any suitable substrate capable of withstanding high temperatures and/or pressures. Substrate 720 may provide structural support for the film stack. For example, substrate 720 may be soda-lime glass, a metal sheet or foil (e.g., stainless steel, aluminum, tungsten), a semiconductor (e.g., Si, Ge, GaAs), a polymer, another suitable substrate, or any combination thereof. Precursor layer 740 may be any suitable CZTS material, such as, for example, the CZTS materials described previously. In particular embodiments, precursor layer 740 comprises Cu, Zn, Sn, and one or more of S or Se. In alternative embodiments, precursor layer 740 comprises Cu, Zn, and Sn. S or Se may later be deposited onto the precursor layer in order to make a suitable CZTS material. Precursor layer 740 may be deposited on substrate 720. Gas inlet 760 and gas outlet 770 may be any suitable gas flow control elements. For example, gas inlet 760 or gas outlet 770 may be a control valve, a variable-speed pump, a pressure-relief valve, a mass-flow controller, a throttle valve, another suitable gas flow control element, or any combination thereof. Gas inlet 760 and gas outlet 770 may be used to provide a gaseous phase to apparatus 700 and to control the pressure of the gaseous phase over time. The gaseous phase my comprise SnS gas, SnSe gas, sulfur gas ($S_2$ or $S_8$), selenium gas, or any combination thereof. Gas inlet 760 may be able to precisely control the partial pressure of each component of the gaseous phase. Gas inlet 760 and gas outlet 770 may also be used to provide a carrier gas to apparatus 700. Apparatus 700 may be capable of performing high-pressure, high-temperature processes. The reaction conditions in apparatus 700 may be precisely controlled, monitored, and adjusted to optimize the reaction yield and sample uniformity. Apparatus 700 may be a constrained volume, with minimal dead space in the reaction chamber. Although FIG. 7 illustrates a particular arrangement of heating coil 710, substrate 720, precursor layer 740, gas inlet 760, and gas outlet 770, this disclosure contemplates any suitable arrangement of heating coil 710, substrate 720, precursor layer 740, gas inlet 760, and gas outlet 770. For example, apparatus 700 may include a flexible continuous web that carries the individual components into the tube furnace. Moreover, although FIG. 7 illustrates a particular number of heating coils 710, substrates 720, precursor layers 740, gas inlets 760, and gas outlet 770, this disclosure contemplates any suitable number heating coils 710, substrates 720, precursor layers 740, gas inlets 760, and gas outlet 770. For example, apparatus 700 may include multiple gas inlets 760 and gas outlets 770, allowing for more precise spatial control of the partial pressure of each component of the gaseous phase.

In particular embodiments, apparatus 700 may anneal precursor layer 740 in the presence of a gaseous phase. Apparatus 700 may be used to anneal a CZTS film without decomposition of the crystalline CZTS phase. In particular embodiments, precursor layer 740 may be introduced into apparatus 700. Gas outlet 770 may then pull a full or partial vacuum in the tube-furnace. Gas outlet 770 may then be closed, such as, for example, with a control valve, and gas inlet 760 may then be used to provide a gaseous phase comprising Sn and one or more of S or Se. Gas inlet 760 may provide a gaseous phase comprising Sn and one or more of S or Se. Gas inlet 760 may be used to create an overpressure of the SnS gas, SnSe gas, sulfur gas ($S_2$ or $S_8$), selenium gas, or any combination thereof. Controlled quantities of each component of the gaseous phase can be introduced into the tube-furnace until a specified partial pressure of each component is reached. Gas inlet 760 may then be closed and precursor layer 740 may then be annealed. The annealing may be performed in a constrained volume under isochoric, isobaric, isothermal, or other suitable conditions. The annealing may be performed at any suitable pressure. For example, annealing may occur under vacuum, under partial vacuum, at atmospheric pressure, or with an overpressure of gas. In particular embodiments, the partial pressure of a particular component of the gaseous phase may range from approximately 0 atm to approximately 10 atm. During annealing, gas inlet 760 and gas outlet 770 may be used to continuously control the partial pressure of each component of the gaseous phase by controlling the inlet and outlet gas flow rates. In particular embodiments, the partial pressure of each component of the gaseous phase may be kept approximately constant over substantially all of the surface of precursor layer 740. Minimizing concentration variations across the surface of precursor layer 740 during annealing may improve the properties or performance of precursor layer 740. In particular embodiments, the partial pressure of one or more components of the gaseous phase may be kept constant during substantially all of the annealing process. In alternative embodiments, the partial pressure of one or more components of the gaseous may vary over time during the annealing process, while still maintaining a partial pressure that is approximately spatially-constant over the surface of precursor layer 740. For example, the gaseous phase may initially have a partial pressure of $S_2$ gas of $p_0$, and the partial pressure may be ramped down to $p_1$ over time ($t_1-t_0$) at a rate of $(p_1-p_0)/(t_1-t_0)$. By maintaining relatively high partial pressures of these gases, the decomposition of precursor layer 740 at high temperatures may be reduced or suppressed by shifting the equilibrium of the CZTS decomposition reaction, such that it is slowed or even reversed. Thus, the CZTS precursor can be annealed at high temperature without any decomposition. In particular embodiments, the gaseous phase may also comprise a carrier gas to facilitate transport of the gaseous phase in apparatus 700. The carrier gas may comprise H, He, $N_2$, $O_2$, Ar, $H_2S$, Kr, $H_2Se$, Xe, another suitable gas, or any combination thereof. In particular embodiments, the partial pressure of the carrier gas may range from approximately 0 atm to approximately 1 atm. In particular embodiments, apparatus 700 may anneal according to one or more of the annealing temperature profiles described previously, such as, for example, an annealing temperature profile described with respect to apparatus 300 or illustrated in FIG. 4. In particular embodiments, precursor layer 740 may comprise Cu, Zn, and Sn. One or more of S or Se may then be deposited onto precursor layer 740 during annealing. For example, one or more of S or Se may be deposited from the gaseous phase onto precursor layer 740 during annealing. As the gaseous phase is heated during annealing, gaseous sulfur or selenium from the gaseous phase may be deposited onto precursor layer 740. Although this disclosure describes annealing precursor layer 740 in a particular manner, this disclosure contemplates annealing precursor layer 740 in any suitable manner.

Figure 8:
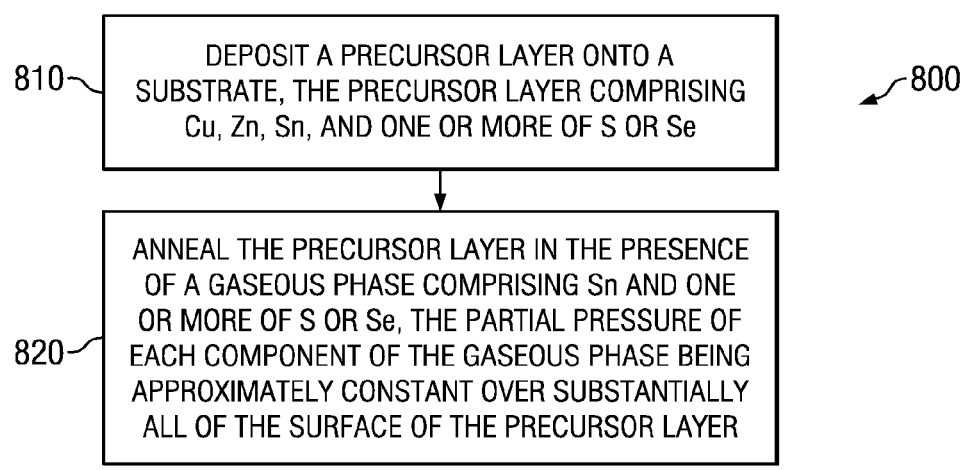
FIG. 8 illustrates an example method for producing a CZTS thin-film using a controlled overpressure.

FIG. 8 illustrates an example method 800 for producing a CZTS thin-film using a controlled overpressure. The method may begin at step 810, where precursor layer 740 is deposited onto substrate 720. Precursor layer 740 may comprise Cu, Zn, Sn, and one or more of S or Se. At step 820, precursor layer 740 may be annealed in the presence of a gaseous phase comprising Sn and one or more of S or Se. The partial pressure of each component of the gaseous phase may be approximately constant over substantially all of the surface of precursor layer 740 for substantially all of the duration of annealing Annealing may be performed in a constrained volume. Particular embodiments may repeat one or more steps of the method of FIG. 8, where appropriate. Although this disclosure describes and illustrates particular steps of the method of FIG. 8 as occurring in a particular order, this disclosure contemplates any suitable steps of the method of FIG. 8 occurring in any suitable order. Moreover, although this disclosure describes and illustrates particular components, devices, or systems carrying out particular steps of the method of FIG. 8, this disclosure contemplates any suitable combination of any suitable components, devices, or systems carrying out any suitable steps of the method of FIG. 8.

Properties of CZTS Materials

The properties of CZTS thin-films manufactured using some of the disclosed embodiments are described below and illustrated in FIGS. 9-13.

Figure 9:
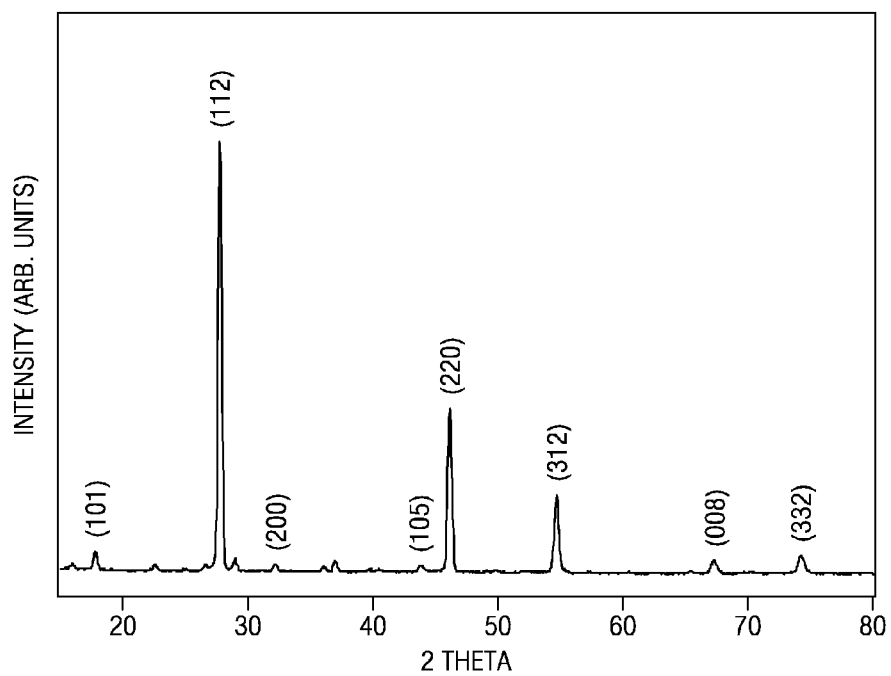
FIG. 9 illustrates an x-ray diffraction pattern of a CZTS thin-film.

FIG. 9 illustrates an x-ray diffraction pattern of a CZTS thin-film. The diffraction pattern shows the primary peaks for CZTS and can be used to establish that the film has the correct crystal structure.

Figure 10:
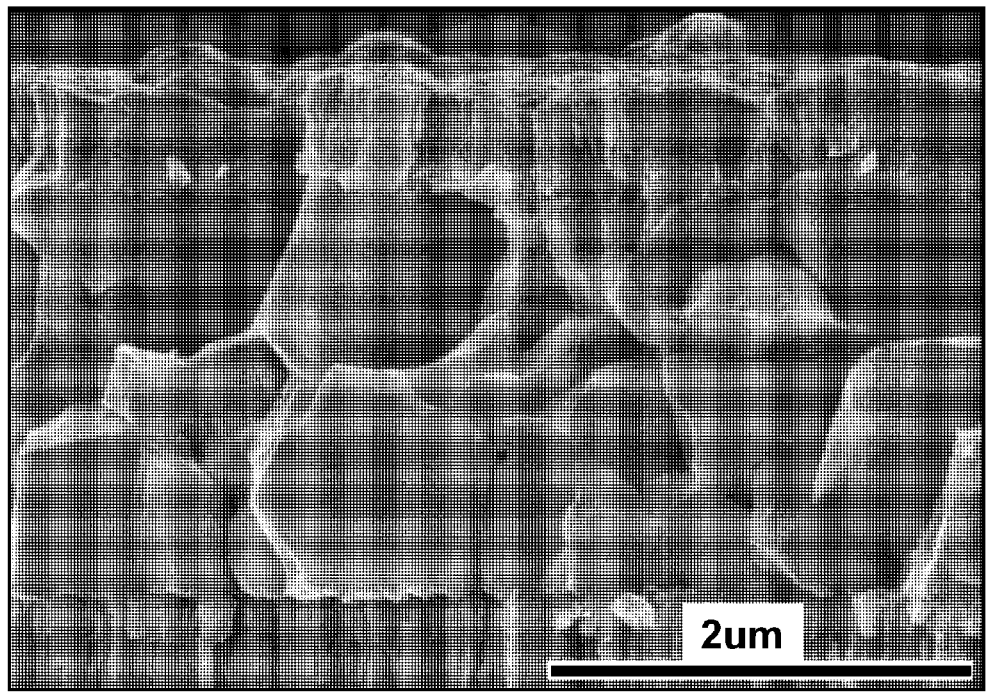
FIG. 10 illustrates a scanning electron microscopy image of a CZTS thin-film.

FIG. 10 illustrates a scanning electron microscopy image of a CZTS thin-film. The SEM image shows that the CZTS thin-film has relatively large grains and minimal defects (e.g., cracks, pores).

Figure 11:
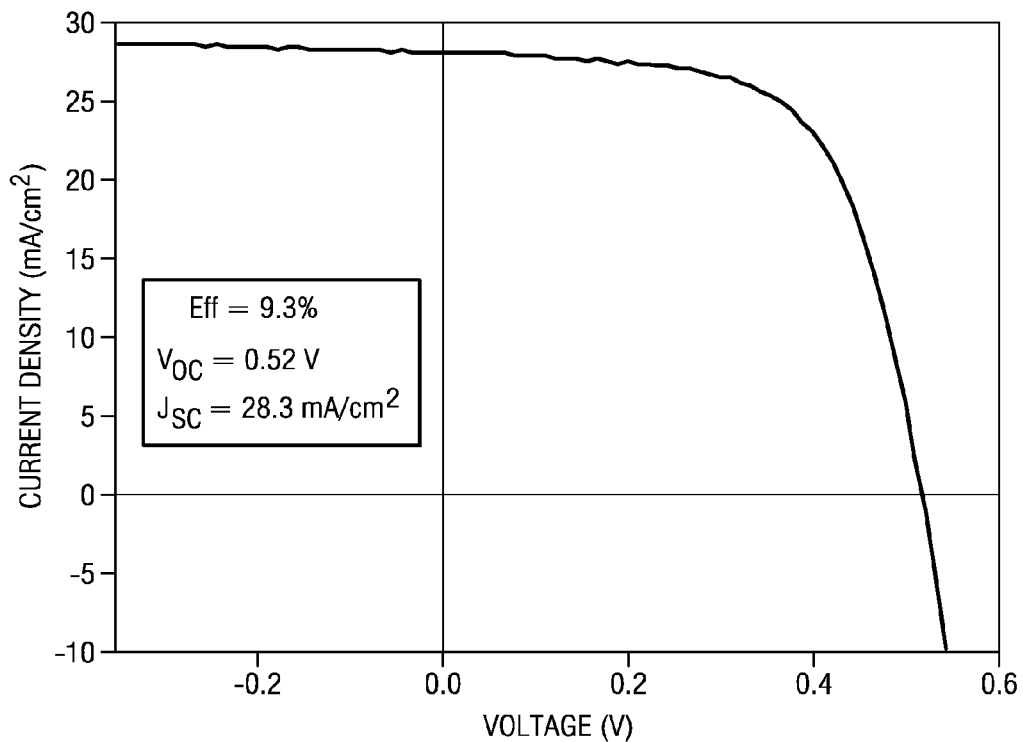
FIG. 11 illustrates a current-voltage measurement of a CZTS-based photovoltaic cell.

FIG. 11 illustrates a current-voltage measurement of a CZTS-based photovoltaic cell.

Figure 12:
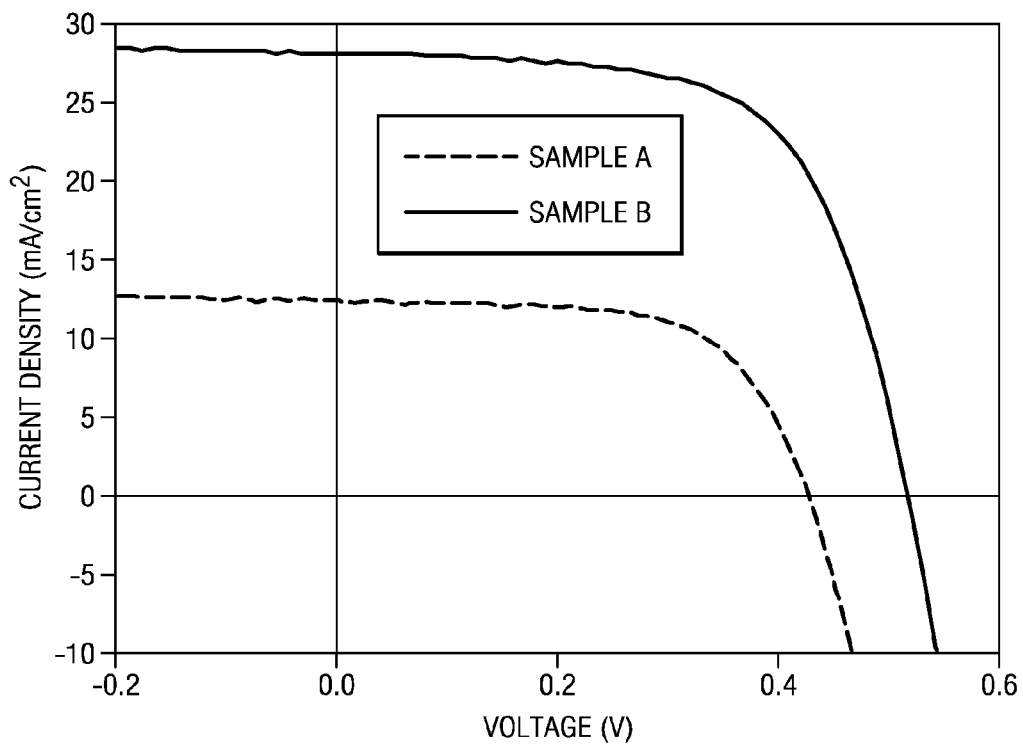
FIG. 12 illustrates current-voltage measurements of various CZTS thin-films.

FIG. 12 illustrates current-voltage measurements of various CZTS thin-films. Sample A was deposited at high temperature and Sample B was deposited at room temperature and annealed using the annealing processes described previously. Sample A was observed to be tin poor due to loss of tin sulfide and had considerably reduced efficiency.

Figure 13:
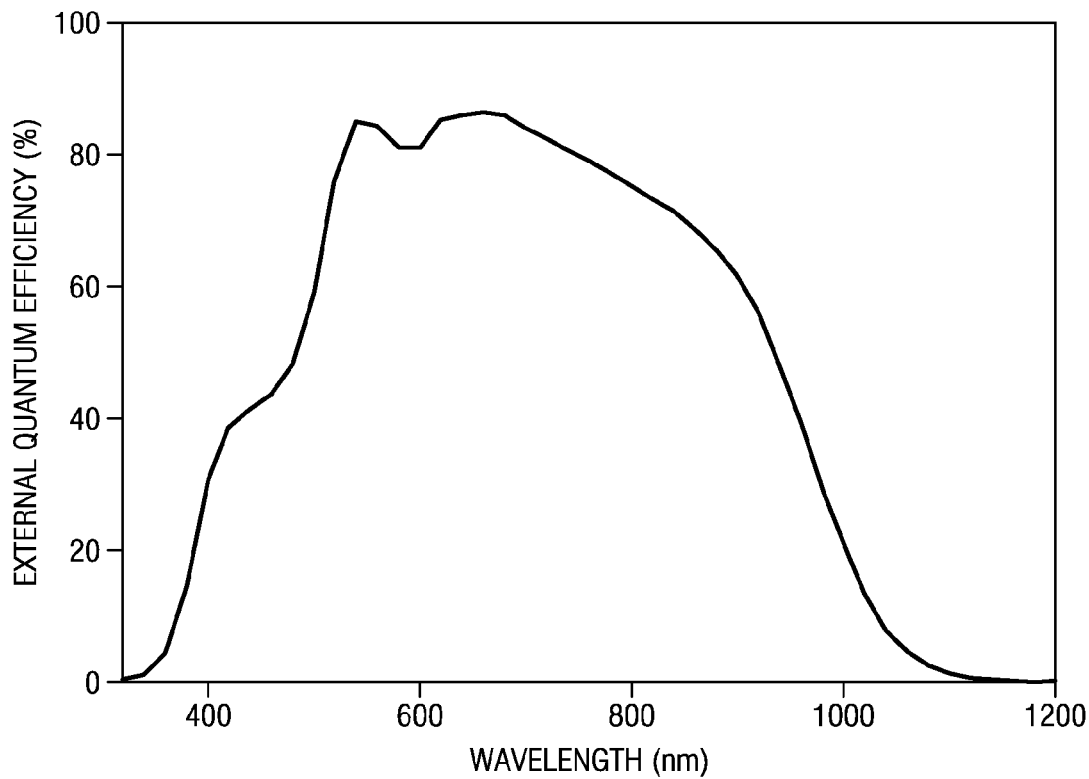
FIG. 13 illustrates an external quantum efficiency measurement of a CZTS-based photovoltaic cell.

FIG. 13 illustrates an external quantum efficiency measurement of a CZTS-based photovoltaic cell. The best efficiency achieved using this methodology was 9.3%, which is either comparable with or, in most cases, exceeds what is possible with other deposition and annealing methods.

CZTS Device Stack

Figure 14:
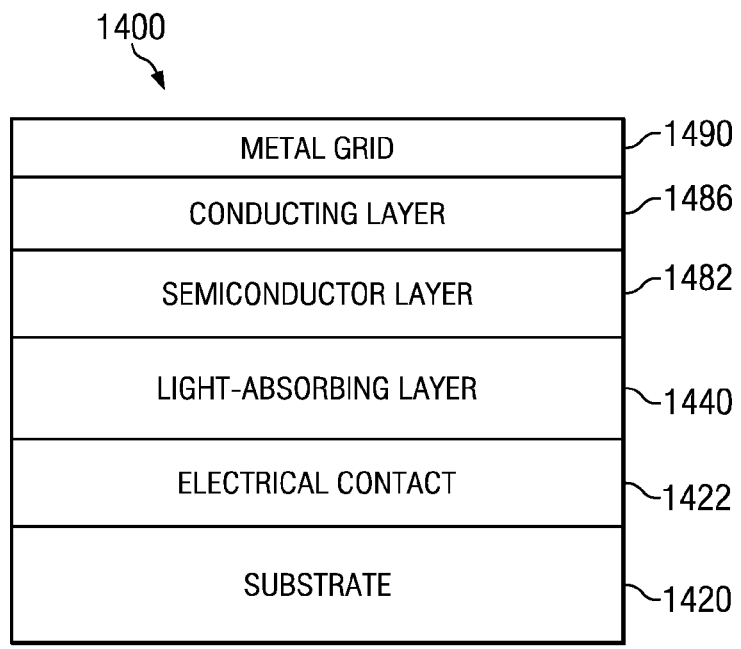
FIG. 14 illustrates an example CZTS device stack.

FIG. 14 illustrates an example CZTS device stack 1400. A CZTS film layer produced by one of the methods described previously may be incorporated into the example device structure illustrated in FIG. 14. Device stack 1400 includes a substrate 1420, an electrical contact 1422, a light-absorbing layer 1440, a semiconductor layer 1482, a conducting layer 1486, and a metal grid 1490. One or more layers of device stack 1400 may be deposited using one or more of chemical-vapor deposition, evaporation, atomic-layer deposition, sputtering, particle coating, spray pyrolysis, spin-coating, electro-deposition, electrochemical deposition, photoelectrochemical deposition, hot-injection, another suitable deposition process, or any combination thereof. Although FIG. 14 illustrates a particular arrangement of substrate 1420, electrical contact 1422, light-absorbing layer 1440, semiconductor layer 1482, conducting layer 1486, and metal grid 1490, this disclosure contemplates any suitable arrangement of substrate 1420, electrical contact 1422, light-absorbing layer 1440, semiconductor layer 1482, conducting layer 1486, and metal grid 1490. For example, the position of semiconductor layer 1482 and light-absorbing layer 1440 may be switched, such that semiconductor layer 1482 may be deposited on substrate 1420 and light-absorbing layer 1440 may be deposited on semiconductor layer 1482. Moreover, although FIG. 14 illustrates a particular number of substrates 1420, electrical contacts 1422, light-absorbing layers 1440, semiconductor layers 1482, transparent conducting layers 1486, and metal grids 1490, this disclosure contemplates any suitable number of substrates 1420, electrical contacts 1422, light-absorbing layers 1440, semiconductor layers 1482, transparent conducting layers 1486, and metal grids 1490. For example, device stack 1400 may include multiple light-absorbing layers 1440 and semiconductor layers 1482, forming multiple p-n junctions. In addition, U.S. application Ser. No. 12/953,867, U.S. application Ser. No. 12/016,172, U.S. application Ser. No. 11/923,036, and U.S. application Ser. No. 11/923,070, the text of which are incorporated by reference herein, disclose additional layer arrangements and configurations for photovoltaic cell structures that may be used with particular embodiments disclosed herein.

In particular embodiments, substrate 1420 may be any suitable substrate capable of withstanding high temperatures and/or pressures. Substrate 1420 may provide structural support for the film stack. For example, substrate 1420 may be soda-lime glass, a metal sheet or foil (e.g., stainless steel, aluminum, tungsten), a semiconductor (e.g., Si, Ge, GaAs), a polymer, another suitable substrate, or any combination thereof. In particular embodiments, substrate 1420 may be coated with an electrical contact 1422. Electrical contact 1422 may be any suitable electrode material, such as, for example, Mo, W, Al, Fe, Cu, Sn, Zn, another suitable electrode material, or any combination thereof. If substrate 1420 is a non-transparent material, then conducting layer 1486 may be transparent to allow light penetration into the photoactive conversion layer. In particular embodiments, substrate 1420 may be replaced by another suitable protective layer or coating, or may be added during construction of a solar module or panel. Alternatively, device stack 1400 may be deposited on a flat substrate (such as a glass substrate intended for window installations), or directly on one or more surfaces of a non-imaging solar concentrator, such as a trough-like or Winston optical concentrator.

In particular embodiments, light-absorbing layer 1440 may be a CZTS thin-film as described herein. Light-absorbing layer 1440 may also be another suitable material, such as CIGS or CdTe. Light-absorbing layer 1440 may be either a p-type or an n-type semiconductor layer. In particular embodiments, device stack 1400 may include multiple light-absorbing layers. The plurality of light-absorbing layers may vary between CZTS thin-films and other types of thin-films, such as CIGS or CdTe thin-films. Although this disclosure describes particular types of light-absorbing layers 1440, this disclosure contemplates any suitable type of light-absorbing layer 1440.

In particular embodiments, semiconductor layer 1482 may form a p-n junction with light-absorbing layer 1440. Semiconductor layer 1482 may be either a p-type or an n-type semiconductor layer. In particular embodiments, semiconductor layer 1482 may include one or more of the following semiconductor materials: silicon (Si), germanium (Ge), tin (Sn), beta iron silicide ($\beta$-FeSi$_2$), indium antimony (InSb), indium arsenic (InAs), indium phosphate (InP), gallium phosphate (GaP), aluminum phosphate (AlP), gallium arsenic (GaAs), gallium antimony (GaSb), aluminum antimony (AlSb), silicon carbide (SiC), tellurium (Te), zinc antimony (ZnSb), mercury telluride (HgTe), led sulfide (PbS), led selenide (PbSe), led telluride (PbTe), cadmium sulfide (CdS), cadmium selenium (CdSe), cadmium tellurium (CdTe), zinc sulfide (ZnS), zinc selenide (ZnSe), zinc telluride (ZnTe), tin telluride (SnTe), copper sulfide ($Cu_{1-x}S$ (x varies from 1 to 2)), copper selenide ($Cu_{1-x}Se$ (x varies from 1 to 2)), copper indium disulfide (CuInS$_2$), copper gallium disulfide (CuGaS$_2$), copper indium gallium disulfide, ($Cu(In_{1-x}Ga_x)S_2$ (x varies from 0 to 1)), copper indium diselenide (CuInSe$_2$), copper gallium diselenide (CuGaSe$_2$), copper indium gallium diselenide ($Cu(In_{1-x}Ga_x)Se_2$ (x varies from 0 to 1)), copper silver indium gallium disulfide-$(Cu_{1-x}Ag_x)(In_{1-y}Ga_y)S_2$ (x varies from 0 to 1, y varies from 0 to 1)), copper silver indium gallium diselenide ($(Cu_{1-x}Ag_x)(In_{1-y}Ga_y)Se_2$ (x varies from 0 to 1, y varies from 0 to 1)), ($Cu_{1-x}Au_x)InS_2$ (x varies from 0 to 1), ($Cu_{1-x}Au_x)CuGaS_2$ (x varies from 0 to 1), $(Cu_{1-x}Au_x)(In_{1-y}Ga_y)S_2$ (x varies from 0 to 1, y varies from 0 to 1), $(Cu_{1-x}Au_x)InSe_2$ (x varies from 0 to 1), $(Cu_{1-x}Au_x)GaSe_2$ (x varies from 0 to 1), $(Cu_{1-x}Au_x)(In_{1-y}Ga_y)Se_2$ (x varies from 0 to 1), $(Ag_{1-x}Au_x)(In_{1-y}Ga_y)Se_2$ (x varies from 0 to 1), $(Cu_{1-x-y}Ag_xAu_y)(In_{1-z}Ga_z)Se_2$ (x varies from 0 to 1, y varies from 0 to 1, z varies from 0 to 1), $(Cu_{1-x}Au_x)_2S$ (x varies from 0 to 1), $(Ag_{1-x}Au_x)_2S$ (x varies from 0 to 1), $(Cu_{1-x-y}Ag_x$-$Au_y)_2S$ (x varies from 0 to 1, y varies from 0 to 1), indium sulfide (In$_2$S$_3$), indium selenide (In$_2$Se$_3$), aluminum nitride (AlN), indium nitride (InN), gallium nitride (GaN), bismuth sulfide (Bi$_2$S$_3$), antimony sulfide (Sb$_2$S$_3$), silver sulfide (Ag$_2$S), tungsten sulfide (WS$_2$), tungsten selenide (WSe$_2$), molybdenum sulfide (MoS$_2$), molybdenum selenide (MoSe$_2$), tin sulfide (SnS$_x$ (x varies from 1 to 2)), tin selenide (SnSe$_x$ (x varies from 1 to 2)), or copper tin sulfide (Cu$_4$SnS$_4$). In particular embodiments, one or more of light-absorbing layer 1440 or semiconductor layer 1482 may also contain up to 80 vol. % of an oxide material selected from the group consisting of magnesium (Mg) oxide, aluminum (Al) oxide, silicon (Si) oxide, titanium (Ti) oxide, vanadium (V) oxide, chromium (Cr) oxide, manganese (Mn) oxide, iron (Fe) oxide, cobalt (Co) oxide, nickel (Ni) oxide, copper (Cu) oxide, zinc (Zn) oxide, gallium (Ga) oxide, germanium (Ge) oxide, selenium (Se) oxide, yttrium (Y) oxide, zirconium (Zr) oxide, niobium (Nb) oxide, molybdenum (Mo) oxide, indium (In) oxide, tin (Sn) oxide, antimony (Sb) oxide, tellurium (Tl) oxide, hafnium (Hf) oxide, tantalum (Ta) oxide, tungsten (W) oxide, mercury (Hg) oxide, lead (Pb) oxide, and bismuth (Bi) oxide.

In particular embodiments, semiconductor layer 1482 may include one or more of the following n-type semiconductor materials: silicon (Si), germanium (Ge), tin (Sn), beta iron silicide ($\beta$-FeSi$_2$), indium antimony (InSb), indium arsenic (InAs), indium phosphate (InP), gallium phosphate (GaP), aluminum phosphate (AlP), gallium arsenic (GaAs), gallium antimony (GaSb), aluminum antimony (AlSb), silicon carbide (SiC), tellurium (Te), zinc antimony (ZnSb), mercury telluride (HgTe), led sulfide (PbS), led selenide (PbSe), led telluride (PbTe), cadmium sulfide (CdS), cadmium selenium (CdSe), cadmium tellurium (CdTe), zinc sulfide (ZnS), zinc selenide (ZnSe), zinc telluride (ZnTe), tin telluride (SnTe), copper sulfide ($Cu_{1-x}S$ (x varies from 1 to 2)), copper selenide ($Cu_{1-x}Se$ (x varies from 1 to 2)), copper indium disulfide (CuInS$_2$), copper gallium disulfide (CuGaS$_2$), copper indium gallium disulfide, ($Cu(In_{1-x}Ga_x)S_2$ (x varies from 0 to 1)), copper indium diselenide (CuInSe$_2$), copper gallium diselenide ($CuGaSe_2$), copper indium gallium diselenide ($Cu(In_{1-x}Ga_x)Se_2$ (x varies from 0 to 1)), copper silver indium gallium disulfide-$(Cu_{1-x}Ag_x)(In_{1-y}Ga_y)S_2$ (x varies from 0 to 1, y varies from 0 to 1)), copper silver indium gallium diselenide $(Cu_{1-x}Ag_x)(In_{1-y}Ga_y)Se_2$ (x varies from 0 to 1, y varies from 0 to 1)), $(Cu_{1-x}Au_x)InS_2$ (x varies from 0 to 1), $(Cu_{1-x}Au_x)CuGaS_2$ (x varies from 0 to 1), $(Cu_{1-x}Au_x)(In_{1-y}Ga_y)S_2$ (x varies from 0 to 1, y varies from 0 to 1), $(Cu_{1-x}Au_x)InSe_2$ (x varies from 0 to 1), $(Cu_{1-x}Au_x)GaSe_2$ (x varies from 0 to 1), $(Cu_{1-x}Au_x)(In_{1-x}Ga_x)Se_2$ (x varies from 0 to 1), $(Ag_{1-x}Au_x)(In_{1-x}Ga_x)Se_2$ (x varies from 0 to 1), $(Cu_{1-x-y}Ag_xAu_y)(In_{1-z}Ga_z)Se_2$ (x varies from 0 to 1, y varies from 0 to 1, z varies from 0 to 1), $(Cu_{1-x}Au_x)_2S$ (x varies from 0 to 1), $(Ag_{1-x}Au_x)_2S$ (x varies from 0 to 1), $(Cu_{1-x-y}Ag_xAu_y)_2S$ (x varies from 0 to 1, y varies from 0 to 1), indium sulfide ($In_2S_3$), indium selenide ($In_2Se_3$), aluminum nitride (AlN), indium nitride (InN), gallium nitride (GaN), bismuth sulfide ($Bi_2S_3$), antimony sulfide ($Sb_2S_3$), silver sulfide ($Ag_2S$), tungsten sulfide ($WS_2$), tungsten selenide ($WSe_2$), molybdenum sulfide ($MoS_2$), molybdenum selenide ($MoSe_2$), tin sulfide ($SnS_x$ (x varies from 1 to 2)), tin selenide ($SnSe_x$ (x varies from 1 to 2)), copper tin sulfide ($Cu_4SnS_4$). Such semiconductors may be doped by adding an impurity of valence-five elements such as nitrogen (N), phosphorus (P), arsenic (As), or antimony (Sb)).

In particular embodiments, semiconductor layer 1482 may include one or more of the following p-type semiconductor materials: silicon (Si), germanium (Ge), tin (Sn), beta iron silicide (β-$FeSi_2$), indium antimony (InSb), indium arsenic (InAs), indium phosphate (InP), gallium phosphate (GaP), aluminum phosphate (AlP), gallium arsenic (GaAs), gallium antimony (GaSb), aluminum antimony (AlSb), silicon carbide (SiC), tellurium (Te), zinc antimony (ZnSb), mercury telluride (HgTe), led sulfide (PbS), led selenide (PbSe), led telluride (PbTe), cadmium sulfide (CdS), cadmium selenium (CdSe), cadmium tellurium (CdTe), zinc sulfide (ZnS), zinc selenide (ZnSe), zinc telluride (ZnTe), tin telluride (SnTe), copper sulfide ($Cu_{1-x}S$ (x varies from 1 to 2)), copper selenide ($Cu_{1-x}Se$ (x varies from 1 to 2)), copper indium disulfide ($CuInS_2$), copper gallium disulfide ($CuGaS_2$), copper indium gallium disulfide, $(Cu(In_{1-x}Ga_x)S_2$ (x varies from 0 to 1)), copper indium diselenide ($CuInSe_2$), copper gallium diselenide ($CuGaSe_2$), copper indium gallium diselenide ($Cu(In_{1-x}Ga_x)Se_2$ (x varies from 0 to 1)), copper silver indium gallium disulfide $(Cu_{1-x}Ag_x)(In_{1-y}Ga_y)S_2$ (x varies from 0 to 1, y varies from 0 to 1)), copper silver indium gallium diselenide $(Cu_{1-x}Ag_x)(In_{1-y}Ga_y)Se_2$ (x varies from 0 to 1, y varies from 0 to 1)), $(Cu_{1-x}Ag_x)InS_2$ (x varies from 0 to 1), $(Cu_{1-x}Au_x)CuGaS_2$ (x varies from 0 to 1), $(Cu_{1-x}Au_x)(In_{1-y}Ga_y)S_2$ (x varies from 0 to 1, y varies from 0 to 1), $(Cu_{1-x}Au_x)InSe_2$ (x varies from 0 to 1), $(Cu_{1-x}Au_x)GaSe_2$ (x varies from 0 to 1), $(Cu_{1-x}Au_x)(In_{1-x}Ga_x)Se_2$ (x varies from 0 to 1), $(Ag_{1-x}Au_x)(In_{1-x}Ga_x)Se_2$ (x varies from 0 to 1), $(Cu_{1-x-y}Ag_xAu_y)(In_{1-z}Ga_z)Se_2$ (x varies from 0 to 1, y varies from 0 to 1, z varies from 0 to 1), $(Cu_{1-x}Au_x)_2S$ (x varies from 0 to 1), $(Ag_{1-x}Au_x)_2S$ (x varies from 0 to 1), $(Cu_{1-x-y}Ag_xAu_y)_2S$ (x varies from 0 to 1, y varies from 0 to 1), indium sulfide ($In_2S_3$), indium selenide ($In_2Se_3$), aluminum nitride (AlN), indium nitride (InN), gallium nitride (GaN), bismuth sulfide ($Bi_2S_3$), antimony sulfide ($Sb_2S_3$), silver sulfide ($Ag_2S$), tungsten sulfide ($WS_2$), tungsten selenide ($WSe_2$), molybdenum sulfide ($MoS_2$), molybdenum selenide ($MoSe_2$), tin sulfide ($SnS_x$ (x varies from 1 to 2)), tin selenide ($SnSe_x$ (x varies from 1 to 2)), copper tin sulfide ($Cu_4SnS_4$). Such semiconductors may be doped by adding an impurity of valence-three elements such as boron (B), gallium (Ga), indium (In), or aluminum (Al), in order to increase the number of free (in this case positive (hole)) charge carriers. In particular embodiments, semiconductor layer 1482 may also contain up to 80 vol. % of one or more of the following oxide materials: magnesium (Mg) oxide, aluminum (Al) oxide, silicon (Si) oxide, titanium (Ti) oxide, vanadium (V) oxide, chromium (Cr) oxide, manganese (Mn) oxide, iron (Fe) oxide, cobalt (Co) oxide, nickel (Ni) oxide, copper (Cu) oxide, zinc (Zn) oxide, gallium (Ga) oxide, germanium (Ge) oxide, selenium (Se) oxide, yttrium (Y) oxide, zirconium (Zr) oxide, niobium (Nb) oxide, molybdenum (Mo) oxide, indium (In) oxide, tin (Sn) oxide, antimony (Sb) oxide, tellurium (Tl) oxide, hafnium (Hf) oxide, tantalum (Ta) oxide, tungsten (W) oxide, mercury (Hg) oxide, lead (Pb) oxide, or bismuth (Bi) oxide.

In particular embodiments, conducting layer 1486 may be a transparent conducting oxide, such as, for example, ZnO/Al, $In_2O_3$/Sn, another suitable transparent conducting oxide, or any combination thereof. In particular embodiments, conducting layer 1486 may be replaced by metal grid 1490. Metal grid 1490 may be deposited using screen-printing. Metal grid 1490 may be arranged in a grid (e.g., fingers and busbars) on one side (or both sides) and a full area metal contact on the other side. Additional layers, such as anti-reflection coatings may also be added.

The layers of device stack 1400 may be deposited using any suitable process. In particular embodiments, the one or more layers of device stack may be deposited (e.g., by conventional sputtering or magnetron sputtering) in vacuum or in an atmosphere that includes at least one of the following gases: Ar, H, $N_2$, $O_2$, $H_2S$, and $H_2Se$. In particular embodiments, one or more of the layers of the multilayer structures described above may be doped (e.g., up to approximately 4 atomic %) with at least one of the following elements: Na, P, K, N, B, As, and Sb.

Miscellaneous

Herein, "or" is inclusive and not exclusive, unless expressly indicated otherwise or indicated otherwise by context. Moreover, "and" is both joint and several, unless expressly indicated otherwise or indicated otherwise by context. Furthermore, "a", "an," or "the" is intended to mean "one or more," unless expressly indicated otherwise or indicated otherwise by context.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, this disclosure encompasses any suitable combination of one or more features from any example embodiment with one or more features of any other example embodiment herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A method comprising:
   depositing a precursor layer onto a substrate, the precursor layer comprising Cu, Zn, and Sn, and one or more of S or Se;

introducing a source-material layer into contact with the precursor layer, the source-material layer comprising Sn and one or more of S or Se; and annealing the precursor layer and the source-material layer, wherein the annealing is performed in a constrained volume and with the source-material layer in contact with the precursor layer while controlling a partial pressure of at least one of gaseous SnS, SnSe, Se, S and any combination thereof which decomposes from the source-material layer during the annealing in the constrained volume to suppress decomposition of the precursor layer.

2. The method of claim 1, wherein the substrate comprises glass.

3. The method of claim 1, wherein the precursor layer comprises crystalline $Cu_2ZnSn(S,Se)_4$.

4. The method of claim 1, wherein the precursor layer comprises approximately 5-50 atomic % Cu, approximately 5-50 atomic % Zn, approximately 5-50 atomic % Sn, approximately 5-50 atomic % S, and approximately 5-50 atomic % Se.

5. The method of claim 1, wherein the precursor layer comprises $Cu_xZn_ySn_z(S_\alpha Se_{1-\alpha})_\beta$, and wherein approximately $0.5 \leq x \leq 3$, approximately $y=1$, approximately $0.5 \leq z \leq 3$, approximately $0 \leq \alpha \leq 5$, and approximately $0 \beta \leq 5$.

6. The method of claim 5, wherein the precursor layer further comprises nanoparticles comprising Cu, Zn, Sn, or one or more of S or Se.

7. The method of claim 1, wherein the precursor layer comprises a first thin-film layer comprising Cu, a second thin-film layer comprising Zn, and a third-film layer comprising Sn.

8. The method of claim 1, wherein the precursor layer comprises:
a first thin-film layer comprising $Cu_aS_b/Cu_aSe_b$, wherein approximately $0.5 \leq a \leq 2$ and approximately $b=1$;
a second thin-film layer comprising $Zn_cS_d/Zn_cSe_d$, wherein approximately $0.5 \leq c \leq 2$ and approximately $d=1$; and
a third-film layer comprising $Sn_eS_f/Sn_eSe_f$, wherein approximately $0.5 \leq e \leq 2$ and approximately $f=1$.

9. The method of claim 1, wherein the source-material layer comprises approximately 30-70 atomic % Sn and approximately 30-70 atomic % S.

10. The method of claim 1, wherein the source-material layer comprises approximately 30-70 atomic % Sn, approximately 30-70 atomic % S, and approximately 30-70 atomic % Se.

11. The method of claim 1, wherein the presence of the source-material layer reduces decomposition of the precursor layer during annealing.

12. The method of claim 1, wherein the presence of the source-material layer reduces sublimation of the precursor layer during annealing.

13. The method of claim 1, wherein the source-material layer sublimes during the annealing to form gaseous SnS, gaseous SnSe, gaseous sulfur, gaseous selenium, or any combination thereof.

14. The method of claim 1, wherein the source-material layer is deposited on a sheet.

15. The method of claim 14, wherein the sheet comprises glass.

16. The method of claim 1, wherein annealing comprises heating the precursor layer to a first temperature of approximately 350 degrees Celsius to approximately 700 degrees Celsius, holding the precursor layer at the first temperature for approximately 5 minutes to approximately 120 minutes, and then cooling the precursor layer to a second temperature of approximately 20 degrees Celsius to approximately 100 degrees Celsius.

17. A method comprising:
depositing a precursor layer onto a substrate, the precursor layer including Cu, Zn, and Sn;
placing a source-material layer in contact with the precursor layer, the source-material layer comprising Sn and one or more of S or Se; and
annealing the precursor layer and the source-material layer,
wherein:
one or more of S or Se is deposited from the source-material layer to the precursor layer during annealing; and
the annealing is performed in a constrained volume and with the source-material layer being in contact with the precursor layer and a partial pressure of at least one of gaseous SnS, SnSe, Se, S and any combination thereof which decomposes from the source-material layer during the annealing in the constrained volume is controlled during the annealing to suppress decomposition of the precursor layer.

18. A method comprising:
depositing a precursor layer onto a substrate, the precursor layer including Cu, Zn, Sn, and one or more of S or Se;
depositing a source-material layer into contact with the precursor layer, the source-material layer comprising Sn and one or more of S or Se; and
annealing the precursor layer and the source-material layer, wherein the annealing is performed in a constrained volume and with the source-material layer being in contact with the precursor layer while controlling a partial pressure of at least one of gaseous SnS, SnSe, Se, S and any combination thereof which decomposes from the source-material layer during the annealing in the constrained volume to suppress decomposition of the precursor layer.

19. A method comprising:
depositing a precursor layer onto a substrate, the precursor layer comprising Cu, Zn, and Sn, and one or more of S or Se;
introducing a source-material layer into contact with the precursor layer, the source-material layer comprising Sn and one or more of S or Se;
annealing the precursor layer in contact with the source-material layer, wherein the annealing is performed in a constrained volume containing at least one of gaseous SnS, SnSe, Se, S and any combination thereof; and
controlling a partial pressure of the at least one of gaseous SnS, SnSe, Se, S and any combination thereof in the constrained volume during the annealing to suppress decomposition of the precursor layer,
wherein at least one of gaseous SnS, SnSe, Se, S and any combination thereof decomposes from the source-material layer during the annealing.

* * * * *